US009685378B2

(12) United States Patent
Yoshikawa et al.

(10) Patent No.: US 9,685,378 B2
(45) Date of Patent: Jun. 20, 2017

(54) METHOD OF DIVIDING PLATE-SHAPED WORKPIECES (71) Applicant: DISCO CORPORATION, Tokyo (JP)

(72) Inventors: Toshiyuki Yoshikawa, Tokyo (JP); Takashi Sampei, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/264,031

(22) Filed: Sep. 13, 2016

(65) Prior Publication Data
US 2017/0076985 A1 Mar. 16, 2017

(30) Foreign Application Priority Data

Sep. 14, 2015 (JP) .................. 2015-180931

(51) Int. Cl.
| H01L 21/78 | (2006.01) |
| B23K 26/08 | (2014.01) |
| B23K 26/03 | (2006.01) |
| B23K 26/38 | (2014.01) |
| H01L 21/66 | (2006.01) |
| B23K 101/40 | (2006.01) |
| B23K 103/00 | (2006.01) |

(52) U.S. Cl.
CPC ............ *H01L 21/78* (2013.01); *B23K 26/032* (2013.01); *B23K 26/0853* (2013.01); *B23K 26/38* (2013.01); *H01L 22/12* (2013.01); *B23K 2201/40* (2013.01); *B23K 2203/56* (2015.10)

(58) Field of Classification Search
CPC combination set(s) only.
See application file for complete search history.

(56) References Cited

U.S. PATENT DOCUMENTS

| 7,507,508 B2 * | 3/2009 | Watanabe | G03F 7/70625 430/30 |
| 2007/0236591 A1 * | 10/2007 | Tam | H01L 27/14618 348/308 |
| 2008/0064187 A1 * | 3/2008 | Brown | B23K 26/03 438/464 |
| 2010/0044359 A1 * | 2/2010 | Sawabe | B23K 26/03 219/121.83 |

(Continued)

FOREIGN PATENT DOCUMENTS

JP 2003-086542 3/2003

*Primary Examiner* — Mamadou Diallo
(74) *Attorney, Agent, or Firm* — Greer Burns & Crain Ltd.

(57) ABSTRACT

Disclosed herein is a method of dividing rectangular plate-shaped workpieces into individual device chips including a detecting step wherein an annular frame to which a plurality of rectangular plate-shaped workpieces are stuck is held on a chuck table and the positions and angles of the projected dicing lines on each of the plate-shaped workpieces are detected, and a dividing step wherein a laser beam having a wavelength which is absorbable by the plate-shaped workpieces is applied from a laser beam applying unit to the plate-shaped workpieces while the chuck table and the laser beam applying unit are being relatively processing-fed and finely adjusted for each of the plate-shaped workpieces on the basis of the positions and angles detected in the detecting step, thereby dividing the plate-shaped workpieces into a plurality of device chips along the projected dicing lines.

1 Claim, 4 Drawing Sheets (56) References Cited

U.S. PATENT DOCUMENTS

| | | | |
|---|---|---|---|
| 2010/0207227 A1* | 8/2010 | Meyer-Berg | H01L 21/561 257/433 |
| 2012/0205353 A1* | 8/2012 | Higuchi | B23K 26/16 219/121.67 |
| 2014/0175070 A1* | 6/2014 | Ohura | B23K 26/18 219/121.69 |

* cited by examiner

METHOD OF DIVIDING PLATE-SHAPED WORKPIECES

BACKGROUND OF THE INVENTION

Field of the Invention

The present invention relates to a method of dividing plate-shaped workpieces.

Description of the Related Art

In the step of fabricating devices including semiconductor devices and optical devices, a grid of projected dicing lines is formed on the surface of a wafer to demarcate it into a plurality of areas, and semiconductor devices including integrated circuits (ICs) and large scale integration (LSI) circuits or optical devices including light-emitting diodes and laser diodes are formed in the demarcated areas. Thereafter, the wafer with the devices formed thereon is divided into device chips along the projected dicing lines. Japanese Patent Laid-Open No. 2003-086542 discloses, in the step of dividing the wafer, a method of cleaving the wafer into a plurality of rectangular plate-shaped workpieces each including a plurality of devices and, after an end face protective film is formed on the cleaved faces, dividing the rectangular plate-shaped workpieces into individual device chips.

SUMMARY OF THE INVENTION

The technology disclosed in Japanese Patent Laid-Open No. 2003-086542 includes the step of dividing a wafer (semiconductor substrate) into a plurality of rectangular plate-shaped workpieces, the step of forming an end face protective film on the end faces of the plate-shaped workpieces, the step of sticking the plate-shaped workpieces to an adhesive sheet (sticky sheet) in such a pattern that the plate-shaped workpieces are spaced from each other in parallel relationship and the boundaries between devices are aligned in line with each other, the step of forming projected dicing lines (scribed cuts) altogether on the plate-shaped workpieces, and the step of dividing the plate-shaped workpiece into individual device chips exerting pressing forces thereto.

However, according to the technology disclosed in Japanese Patent Laid-Open No. 2003-086542, since the plate-shaped workpieces need to be stuck to the adhesive sheet in highly accurately aligned arrays, it requires a large expenditure of labor and time to stick the plate-shaped workpieces to the adhesive sheet. Therefore, the step of dividing the devices remains to be improved in terms of efficiency. Furthermore, accuracy needs to be improved when the projected dicing lines of the arrayed plate-shaped workpieces are divided in block on.

It is therefore an object of the present invention to provide a method of dividing a plate-shaped workpiece into device chips efficiently and highly accurately.

In accordance with an aspect of the present invention, there is provided a method of dividing rectangular plate-shaped workpieces into individual device chips, each of the plate-shaped workpieces having a plurality of devices formed in areas demarcated by projected dicing lines and arranged in at least one array. The method includes a plate-shaped workpiece sticking step, a detecting step, and a dividing step. The plate-shaped workpiece sticking step sticks an adhesive tape to an annular frame having an opening and sticks the rectangular plate-shaped workpieces to a surface of the adhesive tape in such a pattern that the plate-shaped workpieces have shorter sides spaced from each other by predetermined distances in aligned arrays within the opening. The detecting step, after performing the plate-shaped workpiece sticking step, holds the annular frame to which the plurality of rectangular plate-shaped workpieces are stuck on a chuck table of a laser processing apparatus and detects positions and angles of the projected dicing lines on each of the plate-shaped workpieces, with detecting means. The dividing step, after performing the detecting step, applies a laser beam having a wavelength which is absorbable by the plate-shaped workpieces from laser beam applying means to the plate-shaped workpieces while the chuck table and the laser beam applying means are being relatively processing-fed and finely adjusted for each of the plate-shaped workpieces on the basis of the positions and angles detected in the detecting step, thereby dividing the plate-shaped workpieces into a plurality of device chips along the projected dicing lines.

The method according to the present invention allows the plate-shaped workpieces to be divided into device chips efficiently and highly accurately.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described in detail below with reference to the accompanying drawings. However, the present invention should not be limited by the details of the embodiments to be described below. The constituent elements to be described below cover those which can easily be anticipated by persons skilled in the art and also those which are essentially identical thereto. Furthermore, the arrangements to be described below can be combined appropriately. In addition, various arrangements can be omitted, replaced, or changed without departing from the scope of the present invention.

In the description which follows, an XYZ orthogonal coordinate system will be assumed, and the positional relationship between various parts will be described with reference to the XYZ orthogonal coordinate system. Directions along an X-axis lying within a horizontal plane shall be referred to as X-axis directions, and directions along a Y-axis lying within the horizontal plane perpendicularly to the X-axis shall be referred to as Y-axis directions. Directions along a Z-axis lying perpendicularly to the X-axis and the Y-axis shall be referred to as Z-axis directions. The X-axis and the Y-axis are included respectively in an X-plane and a Y-plane which lie parallel to the horizontal plane. The Z-axis directions which lie perpendicularly to the X-plane and the Y-plane extend vertically.

First Embodiment

Figure 1:
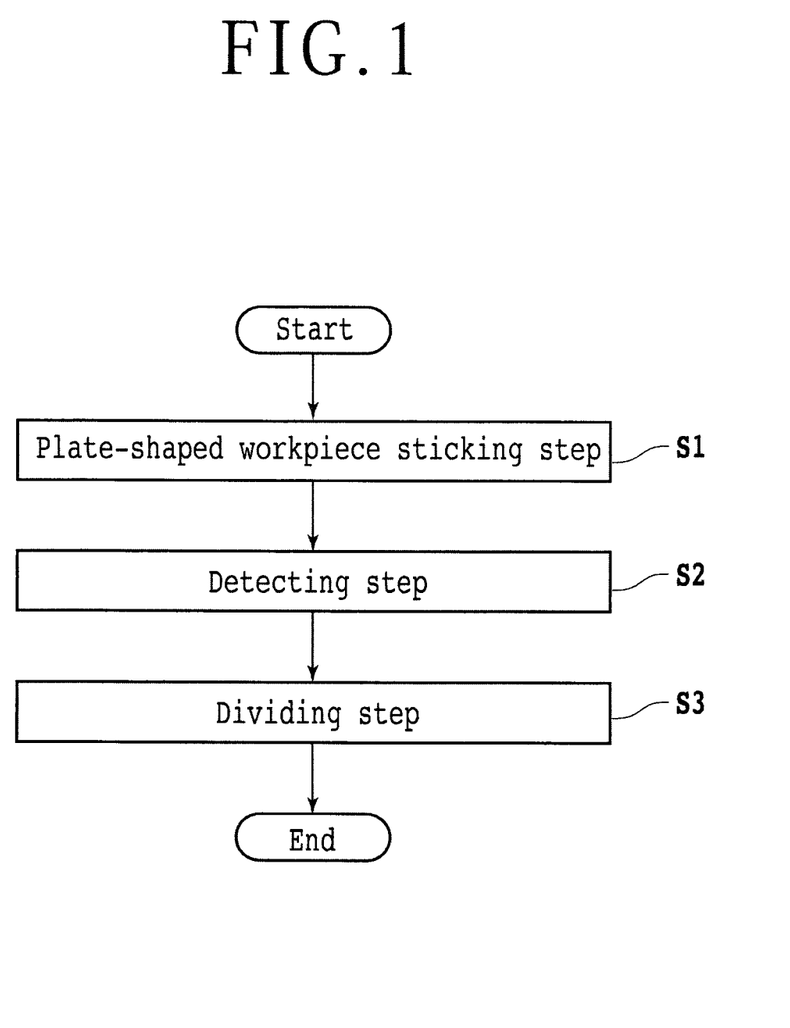
FIG. 1 is a flowchart of a dividing method according to a first embodiment of the present invention.
Figure 2:
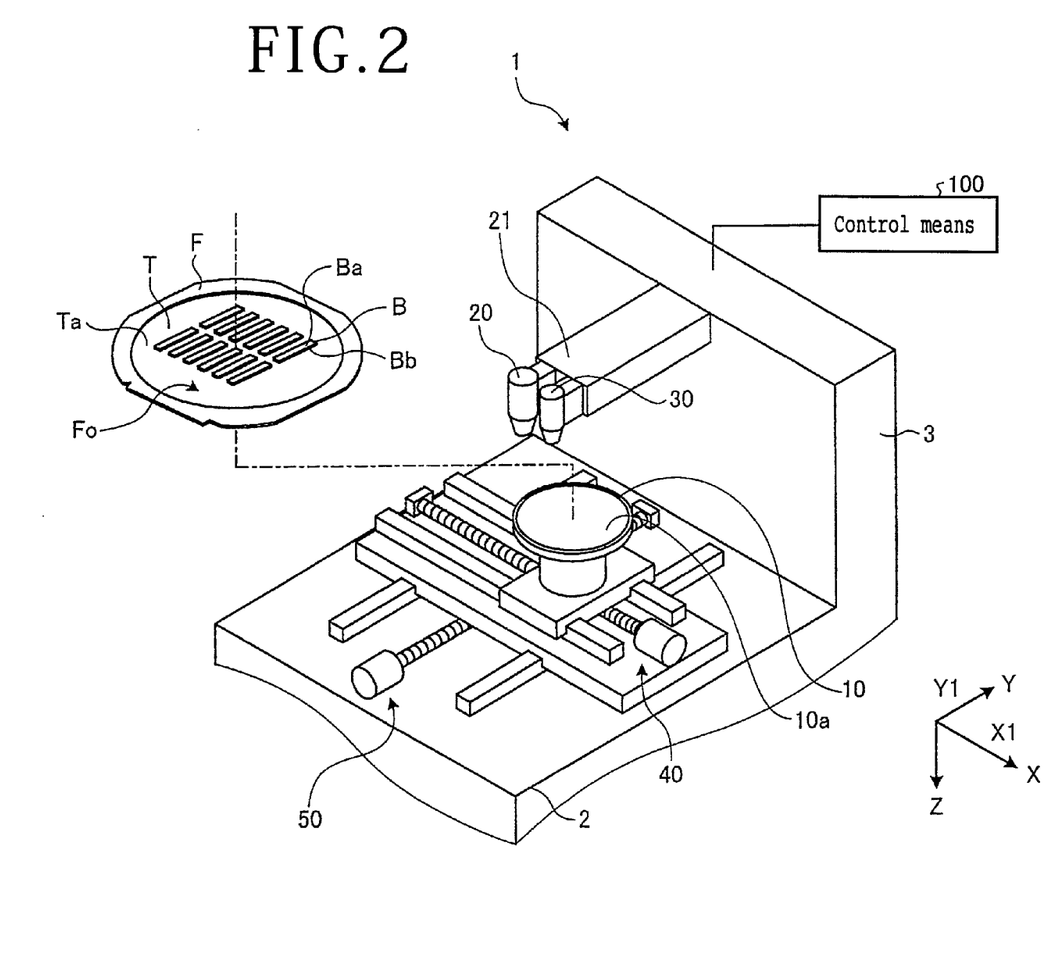
FIG. 2 is a perspective view of a laser processing apparatus for carrying out the dividing method according to the first embodiment.
Figure 3:
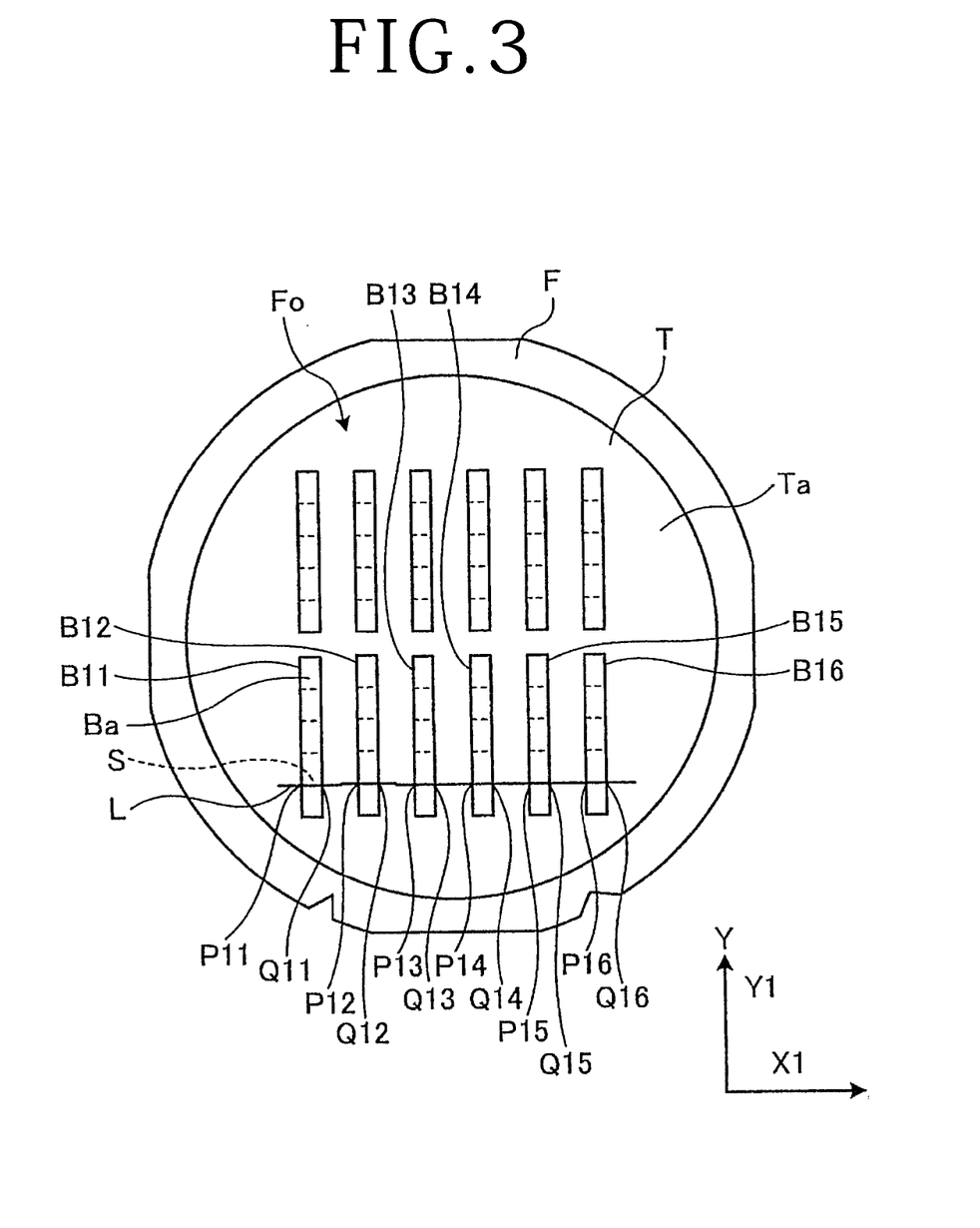
FIG. 3 is a plan view of plate-shaped workpieces to be divided by the dividing method according to the first embodiment.
Figure 4:
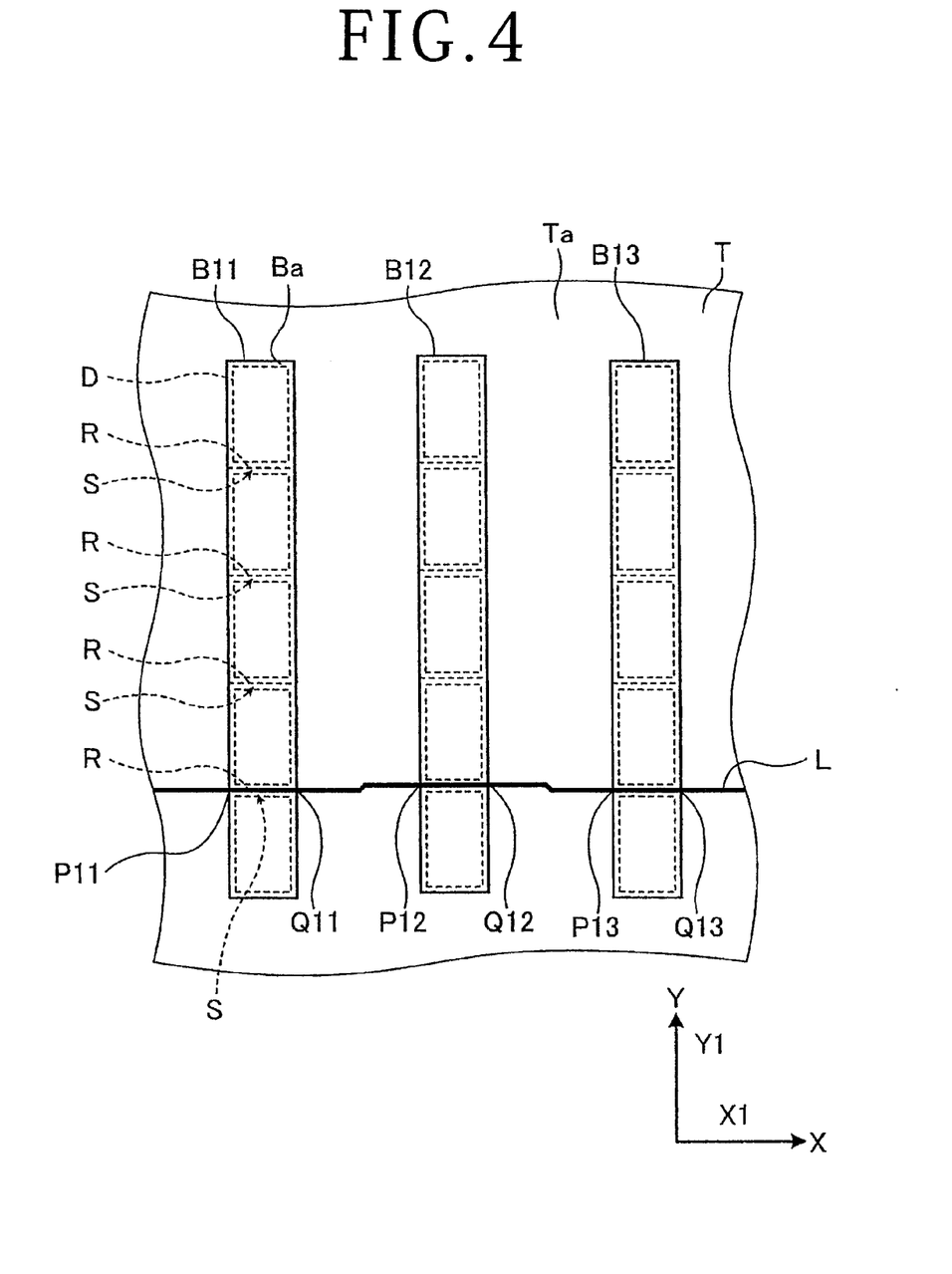
FIG. 4 is an enlarged fragmentary plan view of some of the plate-shaped workpieces depicted in FIG. 3.

FIG. 1 is a flowchart of a dividing method according to a first embodiment of the present invention. FIG. 2 is a perspective view of a laser processing apparatus for carrying out the dividing method according to the first embodiment. FIG. 3 is a plan view of plate-shaped workpieces to be divided by the dividing method according to the first embodiment. FIG. 4 is an enlarged fragmentary plan view of some of the plate-shaped workpieces depicted in FIG. 3.

In the dividing method according to the first embodiment, a laser processing apparatus 1 applies a laser beam to plate-shaped workpieces B to divide them. As depicted in FIG. 1, the dividing method includes a plate-shaped workpiece sticking step S1, a detecting step S2, and a dividing step S3 which are successively carried out in the order named. According to the present embodiment, the plate-shaped workpieces B are stuck to an annular frame F in the plate-shaped workpiece sticking step S1. The positions and angles of projected dicing lines S on each of the plate-shaped workpieces B are detected in the detecting step S2. The plate-shaped workpieces B are divided into a plurality of devices D along all the projected dicing lines S in the dividing step S3. The dividing method is a method carried out by the laser processing apparatus 1 depicted in FIG. 2, i.e., a method using the laser processing apparatus 1.

The laser processing apparatus 1 cuts off the plate-shaped workpieces B along the projected dicing lines S. As depicted in FIG. 2, the laser processing apparatus 1 is provided with at least a chuck table 10 for holding plate-shaped workpieces B thereon, laser beam applying means 20 for applying a laser beam to divide the plate-shaped workpieces B held on the chuck table 10, detecting means 30, X-axis moving means 40, Y-axis moving means 50, and control means 100. According to the present embodiment, the laser processing apparatus 1 is controlled by the control means 100, and operates in steps that are automatically controlled by the control means 100. The control means 100 is primarily constructed as a microprocessor (not depicted) having, for example, an arithmetic processing device including a central processing unit (CPU) or the like and storage means including a read-only memory (ROM), a random access memory (RAM), etc. The control means 100 is electrically connected to display means for displaying states of processing operation and operating means that is used for the operator to register processing contents information or the like.

The plate-shaped workpieces B are formed by cleaving a disk-shaped semiconductor wafer or an optical device wafer which is made of a base material such as silicon, sapphire, gallium, or the like, for example. As depicted in FIGS. 3 and 4, each of the plate-shaped workpieces B has devices D formed in areas demarcated by a plurality of projected dicing lines S formed on a surface Ba of the plate-shaped workpiece B. According to the present embodiment, each of the plate-shaped workpieces B has five devices D formed in areas demarcated by four projected dicing lines S. Each of the plate-shaped workpieces B is divided into individual semiconductor chips when the areas with the devices D formed therein are cut along the projected dicing lines S.

As depicted in FIG. 1, the plate-shaped workpiece sticking step S1 is initially carried out. The plate-shaped workpiece sticking step S1 is a step wherein an adhesive tape T is stuck to an annular frame F and rectangular plate-shaped workpieces B are stuck to a surface Ta of the adhesive tape T in such a pattern that the plate-shaped workpieces B have shorter sides spaced from each other by predetermined distances in aligned arrays within an opening Fo of the annular frame F. The adhesive tape T has an area greater than the opening Fo. The adhesive tape T has an outer edge sticking to the annular frame F.

In the plate-shaped workpiece sticking step S1, the plate-shaped workpieces B are stuck to the surface Ta of the adhesive tape T stuck to the annular frame F in such a pattern that the shorter sides of the plate-shaped workpieces B are spaced from each other by predetermined distances in aligned arrays. The plate-shaped workpieces B are spaced from each other by predetermined distances in aligned arrays along directions parallel to the shorter sides of the plate-shaped workpieces B. In other words, a longer side of a plate-shaped workpiece B is disposed opposite to a longer side of an adjacent plate-shaped workpiece B. According to another method of sticking the plate-shaped workpieces B to the adhesive tape T, for example, the plate-shaped workpieces B are spaced from each other by predetermined distances in aligned arrays along shorter-side directions thereof, and thereafter the surface Ta of the adhesive tape T stuck to the annular frame F is stuck to reverse sides Bb (see FIG. 2) of the plate-shaped workpieces B. According to still another method of sticking the plate-shaped workpieces B to the adhesive tape T, for example, the plate-shaped workpieces B are stuck to the surface Ta of the adhesive tape T stuck to the annular frame F while spacing the plate-shaped workpieces B from each other by predetermined distances in aligned arrays along shorter-side directions thereof. These methods are given by way of illustrative example only, and the present invention should not be limited to these methods. According to the present embodiment, in the plate-shaped workpiece sticking step S1, six plate-shaped workpieces B are spaced from each other by predetermined distances in aligned arrays along shorter-side directions thereof, and two plate-shaped workpieces B in each pair across two sets of such six plate-shaped workpieces B are spaced from each other by predetermined distances in aligned arrays along longer-side directions thereof, so that a total of twelve plate-shaped workpieces B are disposed in aligned arrays, and then the plate-shaped workpieces B are stuck to the annular frame F through the adhesive tape T.

After the plate-shaped workpiece sticking step S1 has been carried out, the detecting step S2 is carried out. The detecting step S2 is a step wherein the annular frame F to which the plate-shaped workpieces B is stuck through the adhesive tape T is held on the chuck table 10 of the laser processing apparatus 1, and the positions and angles of the projected dicing lines S on each of the plate-shaped workpieces B are detected by the detecting means 30.

The chuck table 10 holds the plate-shaped workpieces B to be processed which are placed on a holding surface 10a thereof. Specifically, the chuck table 10 holds the plate-shaped workpieces B that are stuck to the annular frame F through the adhesive tape T and positioned in the opening Fo of the annular frame F. The chuck table 10 is in the shape of a disk whose portion making up the holding surface 10a is made of porous ceramics or the like. The chuck table 10 is connected to a vacuum suction source (not depicted) through a vacuum suction channel (not depicted). The chuck table 10 thus holds under suction the plate-shaped workpieces B placed on the holding surface 10a through the adhesive tape T. The chuck table 10 is processing-fed along the X-axis directions by the X-axis moving means 40, rotated about a central axis (parallel to the Z-axis) by a rotary drive source (not depicted), and indexing-fed along the direction indicated by the arrow Y1 by the Y-axis moving means 50. A plurality of clamps (not depicted) which are actuated by a pneumatic actuator to grip the annular frame F around the plate-shaped workpieces B are disposed around the chuck table 10. The X-axis moving means 40 and the Y-axis moving means 50 are controlled by the control means 100.

The detecting means 30 detects the projected dicing lines S formed on the plate-shaped workpieces B. The detecting means 30 is spaced from the laser beam applying means 20 in the direction indicated by the arrow X1 along the X-axis directions. According to the present embodiment, the detecting means 30 includes an image capturing device including a charge-coupled device (CCD) camera, for example, for capturing an image of the plate-shaped workpieces B. The detecting means 30 sends captured image data to the control means 100. The detecting means 30 is controlled by the control means 100.

In the detecting step S2, the annular frame F to which the plate-shaped workpieces B are stuck through the adhesive tape T is placed on the holding surface 10a of the chuck table 10 that is spaced from the laser beam applying means 20. The laser processing apparatus 1 then holds under suction the plate-shaped workpieces B on the chuck table 10 through the adhesive tape T. The laser processing apparatus 1 grips the annular frame F with the clamps. At this time, it is preferable that the annular frame F be placed on the holding surface 10a in such a fashion that the plate-shaped workpieces B stuck to the adhesive tape T have their shorter-side directions aligned with the X-axis directions and longer-side directions aligned with the Y-axis directions. At this time, the annular frame F depicted in FIG. 3 supports the twelve plate-shaped workpieces B which are arranged in such a pattern that six plate-shaped workpieces B are arrayed along the X-axis directions and two plate-shaped workpieces B are arrayed along the Y-axis directions.

In the laser processing apparatus 1, the control means 100 controls operation of the X-axis moving means 40 and the Y-axis moving means 50 to move the chuck table 10, so that of the plate-shaped workpieces B stuck to the adhesive tape T, the plate-shaped workpiece B positioned at one end of the array along the X-axis directions and one end of the array along the Y-axis directions, e.g., the leftmost and lowermost plate-shaped workpiece B in FIG. 3, has the projected dicing line S (hereinafter referred to as "first projected dicing line S along the Y-axis directions") at one end of the plate-shaped workpiece B along the Y-axis directions, e.g., at the lower end of the plate-shaped workpiece B in FIG. 3, positioned directly below the detecting means 30.

In the laser processing apparatus 1, the control means 100 controls operation of the detecting means 30 to capture successive images of the first projected dicing lines S along the Y-axis directions on the respective plate-shaped workpieces B along the direction indicated by the arrow X1, and store the captured image data in the storage means. The control means 100 controls operation of the X-axis moving means 40 to move the chuck table 10 at a predetermined speed, e.g., a speed of 100 mm/second, along the direction indicated by the arrow X1, and at the same time outputs image capturing signals to the detecting means 30 at predetermined time intervals, e.g., time intervals of 0.05 second. The control means 100 may output an image capturing signal to the detecting means 30 each time the chuck table 10 moves a predetermined distance, e.g., a distance of 5 mm, rather than outputting image capturing signals at predetermined time intervals.

The control means 100 performs an image processing process such as pattern matching or the like on the image data including points P11 through P16 to calculate X, Y coordinate values (X11, Y11) through (X16, Y16) of the points P11 through P16 and tilts θ1 through θ6 of the first projected dicing lines S that pass through the points P11 through P16 with respect to the X-axis directions, and stores the calculated X, Y coordinate values (X11, Y11) through (X16, Y16) and the tilts θ1 through θ6 in the storage means. The central line of each of the projected dicing lines S across the width thereof is referred to as widthwise central line R. The opposite ends of the widthwise central line R are referred to as points P and Q. On the adhesive tape T, there is a set of six plate-shaped workpieces B11, B12, B13, B14, B15, and B16 arrayed along the X-axis directions, and there is another set of six plate-shaped workpieces B spaced from the plate-shaped workpieces B11, B12, B13, B14, B15, and B16 along the Y-axis directions. The tilt θ1 of each of the projected dicing lines S with respect to the X-axis directions refers to the tilt θ1 of the widthwise central line R of the projected dicing line S across the width thereof (along vertical directions in FIG. 3) with respect to the X-axis directions. On the basis of the X, Y coordinate values (X11, Y11) through (X16, Y16) of the points P11 through P16 and the tilts θ1 through θ6 of the first projected dicing lines S that pass through the points P11 through P16 with respect to the X-axis directions, the control means 100 generates a first laser processing line L along the Y-axis directions which extends through the X, Y coordinate values (X11, Y11) through (X16, Y16) of the points P11 through P16 and interconnects the first projected dicing lines S, and stores a laser processing line map including the laser processing line L in the storage means.

Then, the control means 100 controls operation of the Y-axis moving means 50 to indexing-feed the chuck table 10 along the direction indicated by the arrow Y1 by a distance equal to the interval between two adjacent projected dicing lines S for the purpose of generating a second laser processing line map along the Y-axis directions which corresponds to the second projected dicing lines S along the Y-axis directions. The control means 100 generates a laser processing line map which corresponds to the second projected dicing lines S along the Y-axis directions, in the same manner as described above. The control means 100 repeats the above sequence to generate laser processing line maps including laser processing lines L that correspond to all the projected dicing lines S spaced along the Y-axis directions.

After the detecting step S2 has been performed, the dividing step S3 is performed. The dividing step S3 is a step wherein on the basis of the laser processing line maps, the chuck table 10 and the laser beam applying means 20 are relatively processing-fed while their relative positions are being finely adjusted for each of the plate-shaped workpieces B, and the laser beam applying means 20 applies a laser beam having a wavelength absorbable by the plate-shaped workpieces B to divide the plate-shaped workpieces B into a plurality of devices D along the projected dicing lines S.

The laser beam applying means 20 applies a laser beam having a wavelength absorbable by the plate-shaped workpieces B held on the chuck table 10, thereby cutting off the plate-shaped workpieces B. The laser beam applying means 20 includes a casing 21 supported on a column 3 of a main apparatus body 2 and a laser oscillator (not depicted). The laser oscillator oscillates a laser beam having a wavelength absorbable by the plate-shaped workpieces B. The laser beam applying means 20 is controlled by the control means 100.

In the dividing step S3, the control means 100 controls operation of the X-axis moving means 40 and the Y-axis moving means 50 to move the chuck table 10 on the basis of the laser processing line maps for moving the first projected dicing line S along the Y-axis direction on the plate-shaped workpiece B, among the plate-shaped workpieces B stuck to the adhesive tape T, which is positioned at one end of the array along the X-axis directions and one end of the array along the Y-axis directions, e.g., the leftmost and lowermost plate-shaped workpiece B in FIG. 3, to a position irradiated by the laser beam applied by the laser beam applying means 20.

The control means 100 controls operation of the laser beam applying means 20 and operation of the X-axis moving means 40 to cause the laser beam applying means 20 to apply the laser beam to the projected dicing lines S along the first laser processing line L along the Y-axis directions and also to cause the X-axis moving means 40 to move the chuck table 10, i.e., the plate-shaped workpieces B, at a predetermined feed speed along the direction indicated by the arrow X1. As a result, the plate-shaped workpieces B are irradiated with the laser beam along the first laser processing line L along the Y-axis directions, and divided into devices D along the first projected dicing lines S along the Y-axis directions. When the position irradiated with the laser beam reaches the other end (right end in FIG. 3) of the first laser processing line L along the Y-axis directions, the control means 100 controls the laser beam applying means 20 to stop applying the laser beam, and also controls the X-axis moving means 40 to stop moving the plate-shaped workpieces B.

Then, in order to apply the laser beam to the projected dicing line S along the second laser processing line L along the Y-axis directions, the control means 100 controls operation of the Y-axis moving means 50 to indexing-feed the chuck table 10 along the direction indicated by the arrow Y1 by a distance equal to the interval between two adjacent projected dicing lines S. The plate-shaped workpieces B are irradiated with the laser beam along the second laser processing line L along the Y-axis directions, and divided into devices D along the second projected dicing lines S along the Y-axis directions, in the same manner as described above. The control means 100 repeats the above sequence to divide the plate-shaped workpieces B stuck to the adhesive tape T into a plurality of devices D along all the projected dicing lines S.

When the division of the devices D along all the projected dicing lines S on the plate-shaped workpieces B stuck to the adhesive tape T is finished, the control means 100 stops applying the laser beam from the laser beam applying means 20. The control means 100 controls operation of the X-axis moving means 40 and the Y-axis moving means 50 to cause them to move the chuck table 10 to a position spaced from the laser beam applying means 20, after which the control means 100 cancels the suction holding by the chuck table 10 and the gripping by the clamps. The annular frame F is then removed from the chuck table 10.

With the dividing method according to the present embodiment, as described above, the control means 100 detects the positions and angles of the projected dicing lines S on the plate-shaped workpieces B and generates laser processing line maps including laser processing lines L in the detecting step S2. In the dividing step S3, the control means 100 controls operation of the X-axis moving means 40 and the Y-axis moving means 50 and operation of the laser beam applying means 20 to cause the X-axis moving means 40 and the Y-axis moving means 50 to processing-feed the chuck table 10 and the laser beam applying means 20 relatively while their relative positions are being finely adjusted for each of the plate-shaped workpieces B, and also to cause the laser beam applying means 20 to apply the laser beam to the plate-shaped workpieces B along the laser processing lines L thereon, dividing the plate-shaped workpieces B into a plurality of devices D along the projected dicing lines S. Even if the plate-shaped workpieces B stuck to the adhesive tape T are not accurately aligned in arrays in the plate-shaped workpiece sticking step S1, the plate-shaped workpieces B can be divided into the devices D along the projected dicing lines S. Since the plate-shaped workpieces B do not need to be arrayed highly accurately when they are stuck to the adhesive tape T, the labor and time required to arrange the plate-shaped workpieces B on the adhesive tape T can be reduced. In other words, the dividing method according to the present embodiment allows the devices D to be divided from the plate-shaped workpieces B efficiently and highly accurately.

Second Embodiment

A second embodiment of the present invention will be described below. The second embodiment is concerned with another aspect of a detecting step S2 and a dividing step S3. According to the second embodiment, the detecting step S2 and the dividing step S3 are carried out for each laser processing line L.

In the dividing method according to the present embodiment, after the plate-shaped workpiece sticking step S1 has been performed, for each of the laser processing lines L, the positions and angles of the projected dicing lines S on each plate-shaped workpiece B are detected in the detecting step S2, and the plate-shaped workpieces B are divided into a plurality of devices D along the projected dicing lines S in the dividing step S3. More specifically, after the plate-shaped workpiece sticking step S1 has been performed, the laser processing apparatus 1 detects the first projected dicing line S along the Y-axis directions in the detecting step S2 and divides the plate-shaped workpieces B into the devices D along the first projected dicing line S along the Y-axis directions in the dividing step S3. When the position irradiated with the laser beam reaches the other end (right end in FIG. 3) of the projected dicing lines S, the control means 100 controls operation of the laser beam applying means 20 and the X-axis moving means 40 to cause the laser beam applying means 20 to stop applying the laser beam and also to cause the X-axis moving means 40 to stop moving the plate-shaped workpieces B along the direction indicated by the arrow X1. In order to detect the positions and angles of the second projected dicing lines S along the Y-axis directions, the control means 100 controls operation of the Y-axis moving means 50 to cause the Y-axis moving means 50 to indexing-feed the chuck table 10 along the direction indicated by the arrow Y1 by a distance equal to the interval between two adjacent projected dicing lines S. Then, the control means 100 goes back to the detecting step S2, and carries out the detecting step S2 and the dividing step S3 with respect to the second projected dicing lines S along the Y-axis directions. The control means 100 repeats the above sequence to detect the positions and angles of all the projected dicing lines S that are formed at spaced intervals along the Y-axis directions. The plate-shaped workpieces B stuck to the adhesive tape T can thus be divided into a plurality of devices D along all the projected dicing lines S.

As is the case with the dividing method according the first embodiment, the dividing method according to the second embodiment allows the devices D to be divided from the plate-shaped workpieces B efficiently and highly accurately. Inasmuch as the control means 100 detects the positions and angles of the projected dicing lines S in the detecting step S2 and divides the plate-shaped workpieces B into the devices D in the dividing step S3 while moving the plate-shaped workpieces B at a predetermined speed along the direction indicated by the arrow X1, the devices D be divided from the plate-shaped workpieces B more efficiently.

The present invention is not limited to the above embodiments. Various changes and modifications may be made without departing from the spirit of the present invention. For example, it has been described above that the positions and angles of all the projected dicing lines S on the plate-shaped workpieces B are detected in the detecting step S2. However, if the plate-shaped workpieces B stuck to the adhesive tape T are positioned in highly accurately aligned arrays, then the positions and angles of all the projected dicing lines S may not be detected. More specifically, after only the first projected dicing lines S along the Y-axis directions have been detected and the plate-shaped workpieces B have been divided along the first projected dicing lines S along the Y-axis directions, the chuck table 10 may be indexing-fed along the direction indicated by the arrow Y1 by a distance equal to the distance between two adjacent projected dicing lines S, and the plate-shaped workpieces B may be divided along the second projected dicing lines S along the Y-axis directions.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of dividing rectangular plate-shaped workpieces into individual device chips, each of the plate-shaped workpieces having a plurality of devices formed in areas demarcated by projected dicing lines and arranged in at least one array, the method comprising:

a plate-shaped workpiece sticking step of sticking an adhesive tape to an annular frame having an opening and sticking the rectangular plate-shaped workpieces to a surface of the adhesive tape in such a pattern that the plate-shaped workpieces have shorter sides spaced from each other by predetermined distances in aligned arrays within the opening;

a detecting step, after performing the plate-shaped workpiece sticking step, of holding the annular frame to which the plurality of rectangular plate-shaped workpieces are stuck on a chuck table of a laser processing apparatus and detecting positions and angles of the projected dicing lines on each of the plate-shaped workpieces, with detecting means; and a dividing step, after performing the detecting step, of applying a laser beam having a wavelength which is absorbable by the plate-shaped workpieces from laser beam applying means to the plate-shaped workpieces while the chuck table and the laser beam applying means are being relatively processing-fed and finely adjusted for each of the plate-shaped workpieces on the basis of the positions and angles detected in the detecting step, thereby dividing the plate-shaped workpieces into a plurality of device chips along the projected dicing lines.

* * * * *